US012095221B2

(12) United States Patent
Graham et al.

(10) Patent No.: US 12,095,221 B2
(45) Date of Patent: Sep. 17, 2024

(54) DIODE-PUMPED SOLID STATE LASERS

(71) Applicant: PowerPhotonic Ltd., Dalgety Bay (GB)

(72) Inventors: Paul Duncan Graham, Dalgety Bay (GB); Roy McBride, Dalgety Bay (GB); Natalia Trela-McDonald, Dalgety Bay (GB)

(73) Assignee: POWERPHOTONIC LTD. (GB)

( * ) Notice: Subject to any disclaimer, the term of this patent is extended or adjusted under 35 U.S.C. 154(b) by 157 days.

(21) Appl. No.: 17/542,579

(22) Filed: Dec. 6, 2021

(65) Prior Publication Data
US 2022/0181836 A1    Jun. 9, 2022

(30) Foreign Application Priority Data
Dec. 7, 2020 (GB) ........................ 2019216

(51) Int. Cl.
*H01S 3/094* (2006.01)
*H01S 3/06* (2006.01)
*H01S 3/0941* (2006.01)

(52) U.S. Cl.
CPC ........ *H01S 3/09415* (2013.01); *H01S 3/0604* (2013.01); *H01S 3/094049* (2013.01)

(58) Field of Classification Search
CPC .... H01S 5/4012; H01S 5/4075; H01S 5/4025; H01S 5/4031; H01S 5/42; H01S 5/40; H01S 3/094; H01S 3/094049; H01S 3/094003; H01S 2301/206; G02B 6/24; G02B 6/4296; G02B 19/0052; G02B 19/0057; G02B 27/0955–0966;
(Continued)

(56) References Cited

U.S. PATENT DOCUMENTS 5,418,880 A * 5/1995 Lewis ................. G02B 6/4204
                                                           359/625
5,986,794 A    11/1999 Krause et al.
(Continued)

FOREIGN PATENT DOCUMENTS

DE            19820154 A1     9/1999
JP          2006072220 A      3/2006
WO    WO-2007107684 A1 *      9/2007    ......... G02B 19/0028

OTHER PUBLICATIONS

Intellectual Property Office of the UK Patent Office; Search Report for GB2019216.7; May 27, 2021; four pages; Intellectual Property Office of the UK Patent Office, Newport, South Wales, United Kingdom.
(Continued)

*Primary Examiner* — Xinning (Tom) Niu
*Assistant Examiner* — Delma R Forde
(74) *Attorney, Agent, or Firm* — LAW OFFICE OF JESSE D. LAMBERT, LLC (57) ABSTRACT

A diode-pumped solid state laser system and a method of diode-pumping a solid state laser in which the emitter beamlets in the diode bar are directed at a beam transformation optical element which includes a continuous twisted surface to produce a uniform and symmetrised beam in the fast field which is then focused to match an input pump area of the gain medium of the solid state laser. Embodiments to square and rectangular flat-top intensity distributions are described using a Fourier lens and a set of cylindrical orthogonal lenses.

19 Claims, 8 Drawing Sheets

(58) Field of Classification Search
CPC .............. G02B 27/0977; G02B 27/0916; G02B 27/09; G02B 27/0922; G02B 27/095

See application file for complete search history.

(56) References Cited

U.S. PATENT DOCUMENTS

| | | | |
|---|---|---|---|
| 6,421,178 | B1 | 7/2002 | Lissotschenko et al. |
| 6,437,896 | B1 | 8/2002 | Lissotschenko et al. |
| 6,462,883 | B1 | 10/2002 | Zhijiang et al. |
| 6,556,352 | B2 | 4/2003 | Zhijiang et al. |
| 8,520,311 | B2 | 8/2013 | Krause et al. |
| 2004/0130793 | A1 | 7/2004 | Mikhailov et al. |
| 2008/0137707 | A1 | 6/2008 | Mikliaev et al. |
| 2011/0043899 | A1* | 2/2011 | Erlandson ........... H01S 3/2341 359/347 |
| 2011/0157706 | A1 | 6/2011 | Mitra et al. |
| 2012/0050717 | A1* | 3/2012 | Inoue ............... G02B 27/4255 359/574 |
| 2015/0104180 | A1* | 4/2015 | Zimer ................ H01S 5/142 398/95 |

OTHER PUBLICATIONS

Intellectual Property Office of the UK Patent Office; Combined Search and Examination Report for GB2019216.7; May 26, 2021; one page; Intellectual Property Office of the UK Patent Office, Newport, South Wales, United Kingdom.

European Patent Office, Search Report for EP21212491.1; Apr. 6, 2022; two pages; European Patent Office, Rijswijk, The Netherlands.

European Patent Office, Search Report/Opinion for EP21212491.1; 2022; eight pages; European Patent Office, Rijswijk, The Netherlands.

Fan, Z. et al; Beam Concentration and Homogenization for High Power Laser Diode Bar; Sep. 1, 2008; 5 pages, esp. p. 4406, LH col. para. 1; p. 4410, RH col., para. 3; figs. 1-7; Optics Communications; Elsevier, Amsterdam, The Netherlands.

Graham, P. et al; Twisted Surface Homogenizer for Enhanced Diode-Pumping of Disk Lasers; Oct. 3, 2021; 2 pages, esp. p. 1, para. 1-p. 2, para. 2; figs. 1-3; Laser Congress 2021; Washington, D.C., U.S.

* cited by examiner

DIODE-PUMPED SOLID STATE LASERS

The present invention relates to a diode-pumped solid state laser system and a method of diode-pumping a solid state laser. In particular, the invention relates to a beam transformation method for the highly asymmetric beams produced by a laser diode array to produce a uniform intensity distribution to pump a solid state laser with a disk shaped pump area, such as a thin disk laser (TDL).

Diode-pumped thin-disk lasers can offer high power, high efficiency, and good beam quality simultaneously. Efficient cooling enabled by the geometry of the thin disk lasers results in a reduction of the thermal lensing effect and thermally induced aberrations by orders of magnitude compared to typical high-power solid-state lasers. It is desirable for the pump power density to be constant across the pump area to ensure uniform absorption and avoid local damage. When this is achieved, the output power from thin disk lasers can be scaled by increasing the pump spot area at a constant pump power density while retaining the efficiency benefits of thermal management.

Laser diode bars and stacks are characterised by strong asymmetric output beams, with a single mode Gaussian beam in the fast axis and a multimode super-Gaussian distribution in the slow-axis direction. Such characteristics makes beam homogenisation and symmetrisation challenging in optical systems to produce the ideal uniform and symmetric flat top distribution at the disk for pumping.

The most common methods of homogenisation of pump intensity distribution on the disk employ fiber-coupled laser diodes or high-power diode-laser stacks with a glass rod homogenizer. Alternatively, a fiber bundle can be used as a homogeniser. Such fiber coupled diodes and rod homogenisers or fiber bundles have disadvantages in system complexity, cost and efficiency.

Standard methods for beam homogenisation using lens arrays are not suitable due to the fast-axis beam properties, namely small beam diameter and high coherence, as they result in a highly inhomogeneous intensity distribution due to diffraction effects.

In order to achieve a symmetric spot from a laser diode array, beam transformation methods such as twisting, stacking and offsetting/redirecting of the individual emitter beams in the laser diode array are used and find their application in many fibre-coupling systems.

Many of these systems use micro-prisms or micro-lenses to rotate the divergence of each element. Such optical systems for geometrical beam transformation often rely on discreet surfaces which are typically difficult to manufacture and introduce efficiency issues in transition. Such surfaces are designed to match intensity distribution of the individual emitter beams (beamlets) and are therefore strongly pitch dependant and sensitive to alignment. Pitch dependant methods become particularly challenging to manufacture for densely packed arrays due to the small emitter pitch.

U.S. Pat. No. 6,556,352 describes a fibre laser comprising one laser diode array, a laser fiber with inner cladding, a beam offsetting means, a beam rearranging means, an optical system disposed between said beam offsetting means and said beam redirection means, and a focusing means for coupling the beam from said laser diode array into said inner cladding, wherein said beam offsetting means collimates the beams from the emitters in the fast axis and offsets said beams from each other along the fast axis, and said optical system collimates the beams from said beam offsetting means in the slow axis and allows each of the beams to strike upon said beam redirection means so the beams travel one or a plurality of predetermined directions after the beam redirection means.

U.S. Pat. No. 6,421,178 describes a device for coupling a laser diode array into a fibre. The device is for optical beam transformation of one or more ray bundles having an oblong beam cross-section in the x-y-plane using optical elements that have optically active interfaces arranged along the beam path, comprising: at least one optical element designed as a continuous angle transformation element having an optical interface that, along the x-axis, has a continuously varying inclination in the beam direction relative to the z-axis direction, and causes a continuously varying inclination of the beam direction with respect to the y-axis; at least one optical element including a first angle transformation element with one or more optical interfaces, which, along the x-axis, has a continuously varying inclination in beam direction relative to the y-axis; a Fourier transform array having a back focal plane; and a second angle transformation element with one or more optically active interfaces, which, along the y-axis, has a continuously varying inclination in beam direction relative to the x-axis; whereby said first angle transformation element and second angle transformation element are each arranged and positioned in one of a front focal plane and said back focal plane of said Fourier transform array. The optical interface of the first angle transformation element has the form of a surface twisted around an x-axis running at right angles to the beam axis. Pictorially, such a surface comes about if one where to take a surface lying in the x-y-plane and twist the outer ends, for example those in the x-direction, in opposite rotational directions so that the x-axis itself forms the untwisted, neutral fibre. Thereby the possibility also exists to realise continuously increasing or decreasing inclination angles over the span of the component in the x-direction or also to set variable inclination angles section-wise in different directions. While the first-mentioned shape is similar to a "propeller-like" surface, the second shape has a conic-section-like, furrowed surface. We will refer to such a surface as a continuous twisted surface.

In U.S. Pat. Nos. 6,556,352 and 6,421,178, the first surface is designed to offset beams in the fast-axis. The separated beams are then redirected by the second surface. The individual emitter beams are treated separately and arranged so that there is no overlap at the second (re-directing) surface which would translate to efficiency loss. U.S. Pat. Nos. 6,556,352 and 6,421,178 offer a solution for spot symmetrisation, but they do not produce a uniform flat top intensity distribution desirable for solid-state laser pumping and particularly thin disk pumping.

It is therefore an object of the present invention to provide a diode-pumped solid state laser which includes a simple optical train to obtain a uniform and symmetric flat top distribution at the solid state pump area.

It is also an object of the present invention to provide a method of diode pumping a solid state which obviates or mitigates at least some of the disadvantages of the prior art.

According to a first aspect of the present invention there is provided a diode-pumped solid state laser comprising:
  a laser diode array formed of a plurality of emitters in a laser diode bar, the emitters arranged along an x-axis, being a slow axis, with a height in a y-axis, being a fast axis, to direct a beamlet from each emitter in a direction parallel to a z-axis, in a x,y,z coordinate system;
  a solid state active medium having an input pump area;
  an optical train, located between the laser diode array and the solid state laser, comprising:

a beam transformation optical element, positioned to intersect the beamlets, the beam transformation optical element including a first continuous twisted surface in which the fast axis gradient varies along the slow axis, causing beamlet redirection in the fast axis; and a focusing surface, positioned to intersect the beamlets from the first continuous twisted surface and focus the beamlets into a uniform and symmetrised beam at a focal plane;

characterised in that:

a portion of neighbouring beamlets overlap in the slow axis at focusing surface to result in overlapping in the fast axis at the focal plane giving the uniform and symmetrised beam; and the input pump area is positioned at the focal plane.

By overlapping the beamlets on the focusing surface, the requirement for individual beam directing optics and particularly, discrete surfaces matched to emitter pitch on the laser diode bar is removed. This provides a simplified optical train.

The laser diode array may include a fast axis collimator. The laser diode array may include a slow axis collimator. These as are known in the art for providing collimated beamlets from the emitters.

Preferably, the beam transformation optical element is a refractive optical element. Alternatively, the beam transformation optical element is a reflective optical element. In this way, the continuous twisted surface may be provided on a first surface of an optical element with a reflective coating applied on a reverse surface, thereby providing a reflective optical element.

Preferably, the focusing surface is provided on a Fourier lens. Alternatively, the focusing surface is provided on a set of two orthogonal cylindrical lenses. In this way, the at least one continuous twisted surface can be modelled to produce a desired uniform and symmetrised beam in the far field, so that on passing through the Fourier lens, the desired beam is at the focal plane of the lens.

In an embodiment, the optical train consists of a beam transformation optical element and a Fourier lens. This provides a compact arrangement. In an alternative embodiment, the optical train consists of a single optical element wherein the beam transformation optical element is a plano-convex focusing lens with the first continuous twisted surface written on the planar side. In this way, compactness of the system is improved.

Preferably, the continuous twisted surface has a linearly varying gradient in the fast-axis. In this way, each diodes slow axis beamlet extent will see the same variation in angle but over a different angular range. In an alternative arrangement, the gradient is adjusted across the surface. This can allow for redistribution of power from the emitters to compensate for a dead emitter. In an embodiment, the twisted surface has a v-shaped gradient in the fast axis. In this way, a diode bar with a dead emitter can be considered as two adjacent bars, and the beamlets from each adjacent bar are directed into the same angular range, by repeated angular binning, to compensate for the missing emitter.

The beam transformation optical element may include a plurality of continuous twisted surfaces. The plurality of twists may be along the slow axis. In this way, the depths required to be cut on the surface to form the gradients can be kept within manufacturing capabilities for long diode bars. The plurality of twists may be along the fast axis. There may be a plurality of continuous twisted surfaces arranged in a two dimensional array.

Preferably there are at least 11 emitters in the diode bar. More preferably there are at least 19 emitters on the diode bar. The more diode emitters used provides a greater degree of uniformity. There may be more than one diode bar, with the diode bars being arranged in a stack. For a diode bar stack, the beam transformation optical element may comprise a plurality of twists arranged in parallel along the fast axis to produce a tiled surface.

Preferably, the uniform and symmetrised beam has a flat-top square intensity distribution. Alternatively, the uniform and symmetrised beam has a flat-top rectangular intensity distribution. These distributions match the input pump area of the gain medium in the solid state laser.

According to a second aspect of the present invention there is provided a method of pumping a solid state laser comprising the steps:

providing at least one diode bar having an array of emitters, each emitter having an output beamlet;

directing the output beams to be incident upon a beam transformation optical element, the beam transformation optical element including at least a first continuous twisted surface in which the fast axis gradient varies along the slow axis, causing beamlet redirection in the fast axis;

directly focusing the beamlets from the at least a first continuous twisted surface to form a uniform and symmetrised beam at a focal plane via a focusing surface;

characterised in that:

at least a portion of neighbouring beamlets overlap at the focusing surface; and the beam is incident on an input pump area of the solid state laser at the focal plane.

In this way, a simple optical train consisting of only a beam transformation optical element and a focusing surface can be used to provide a compact pumping system for a solid state laser.

Preferably the diode pumped solid state laser is according to the first aspect.

Preferably, neighbouring beamlets also overlap at the twisted surface. In this way, the overlap of beamlets in the far field pattern can be optimised.

In the description that follows, the drawings are not necessarily to scale. Certain features of the invention may be shown exaggerated in scale or in somewhat schematic form, and some details of conventional elements may not be shown in the interest of clarity and conciseness. It is to be fully recognized that the different features and teachings of the embodiments discussed below may be employed separately or in any suitable combination to produce the desired results.

Embodiments of the present invention will now be described, by way of example only, with reference to:

FIGS. 2A and 22B are illustrations of a continuous twisted surface shown as an (2A) tonal map and (2B) mesh for use in the laser of FIG. 1;

Figure 1A:
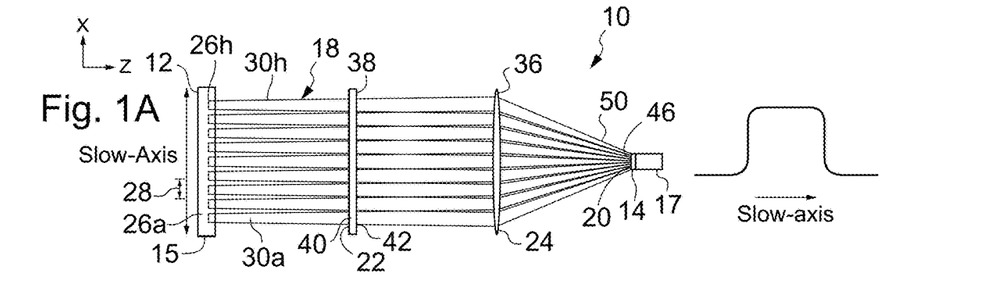
FIGS. 1A and 1B are schematic illustrations of a diode pumped solid state laser in the (1A) x-z plane and (1B) y-z plane according to an embodiment of the present invention.
Figure 1B:
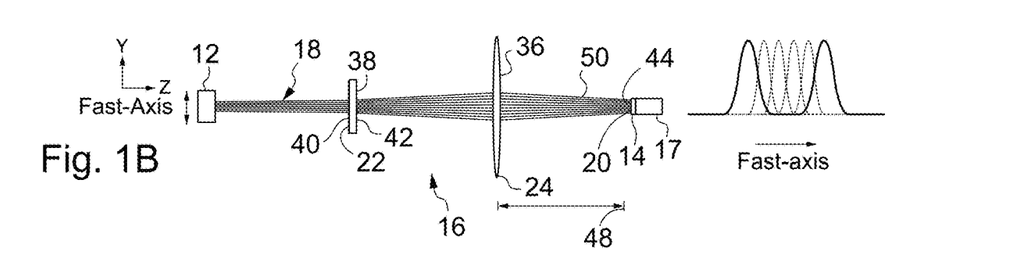

Reference is initially made to FIGS. 1A and 1B of the drawings which illustrates a diode-pumped solid state laser system, generally indicated by reference numeral 10, according to an embodiment of the present invention. Laser 10 includes a laser diode array 12 used to pump a solid state active medium 14 with an optical train 16 positioned therebetween to direct a beam 18 from the array 12 into an input beam 50 matching a pump area 20 of the solid state active medium 14. The optical train 16 comprises a beam transformation optical element 38 having a continuous twisted surface 22 and a focusing surface 24.

The laser diode array 12 is a standard diode bar 15, which in this illustration has nine diode emitters 26a-h, though there may be any number in the linear array. The emitters 26a-h are separated from each other by a set pitch 28 along an x-axis in an x-y-z coordinate system, referred to as the slow axis, and each emitter produces a respective beamlet 30a-h. The orthogonal direction on the face of the laser diode bar provides the fast axis along the y-axis. As is known in the art, a fast-axis collimator is part of the laser diode bar. An optional slow-axis collimator may also be present as part of the laser diode array 12.

The solid state active medium 14 is a laser crystal and may be a thin disk. The crystal provides a face which defines the input pump area 44 of the active gain medium 14. The active medium 14 will form part of a solid state laser 17 as is known in the art. By the dimensions considered, the solid state laser may be a thin disc laser.

Focusing surface 24 is formed on an optical element 36 which is a focussing lens 36. In a preferred embodiment the lens is a Fourier lens. Use of a Fourier lens projects a far field image of a beam onto the focal plane of the lens at the focal length from the focusing surface of the lens.

The continuous twisted surface 22 is formed on an optical element 38. The beam transformation optical element 38 is cuboid in shape and made of fused silica or the like material which is suitable for machined by laser writing on a face thereof. The continuous twisted surface 22 is machined into a rectangular entry face 40 while the rectangular exit face 42 is planar. The continuous twisted surface 22 may be considered as a beam transformation surface. The continuous twisted surface 22 has a linearly varying gradient in the fast-axis. The gradient switches along the slow axis having a minimum at the centre of the optical element 38. Pictorially, such a surface 22 comes about if one where to take a surface lying in the x-y-plane and twist the outer ends, for example those in the x-direction, in opposite rotational directions so that the x-axis itself is untwisted. There is continuously increasing or decreasing inclination angles over the span of the element in the x-direction providing a shape similar to a "propeller-like" surface.

A mathematical description of the surface 22 is provided as a surface definition of the design/input face 40.

Starting with a rectangular design space with $L_x$, defining the extent of the x-axis, and $L_y$, the extent of the y-axis, the following expression describes the depth value z, at each position in this region:

$$z(x, y) = \tan\left(\alpha\left(-1 + \frac{2x}{L_x}\right)y\right) - \tan\left(\alpha\frac{L_y}{2}\right);$$

$$\text{where } \begin{cases} x \in \mathbb{Z} : -\frac{L_x}{2} \le x \le \frac{L_x}{2} \\ y \in \mathbb{Z} : -\frac{L_y}{2} \le x \le \frac{L_y}{2} \end{cases}$$

Where $\alpha$ is the peak absolute angle of the surface, found at the min/max value of x.

Figure 2A:
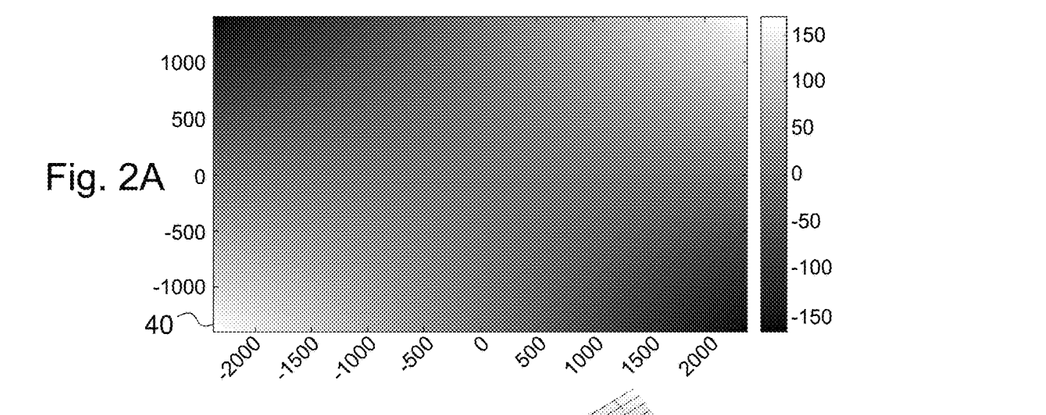
Figure 2B:
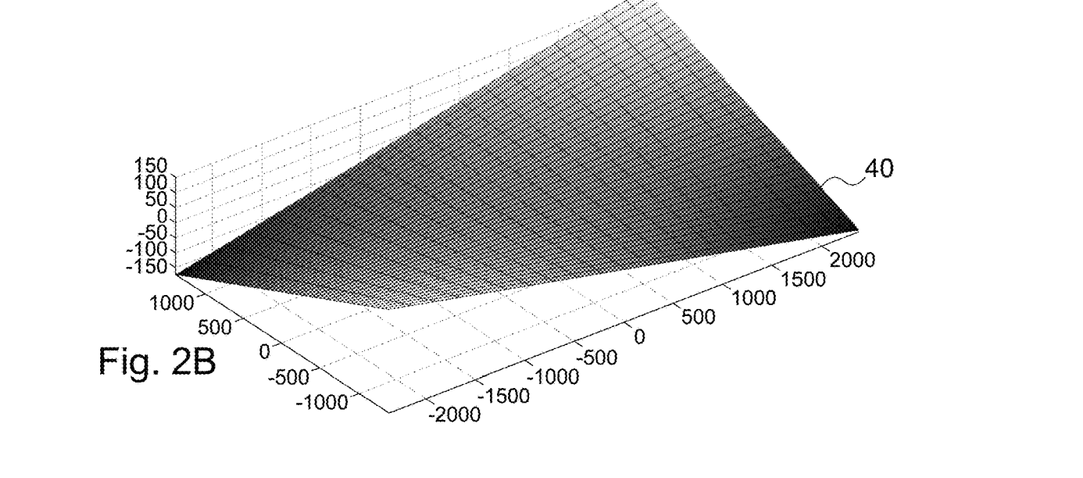

FIG. 2A illustrates tonal map of the design face 40, with FIG. 2B showing a mesh of the design face 40.

The components are arranged with the continuous twisted surface 22 between the emitters 26 and the focusing surface 24. The active medium 14 is positioned so that the input face 46 of the input pump area 44 is at the focal plane 48 of the focusing surface 24. In the embodiment of FIGS. 1A and 1B the system consists of the laser bar 15 with the array of emitters 26, the beam transformation optical element 38, the focusing optical element 36 and the active medium 14. The components are spaced apart, in order, along the z-axis. A first embodiment, which may be considered as the basic configuration, consists of a laser diode array 12 with a plurality of emitters (LD bar 15) 26, a refractive twister optic 38, a Fourier lens 36 and a solid-state laser 14. The beam transformation element 38 is a single continuous refractive surface element fabricated in fused silica. A Fourier lens 36 is then placed after the beam transformation element 38 to generate a uniform and symmetrised beam 50 at its focus.

In this way, the continuous twisted surface 22 manipulates each beamlet 30a-h from each emitter 26a-h in the laser diode array 12 into a desired square or rectangular gaussian intensity distribution and profile in the far field. The focusing surface, being preferably a Fourier lens, focuses the beam 50 of overlapping beamlets 30a-h, to generate a spot with the far field properties at its focal plane 48. It will be apparent that the distance between the continuous twisted surface 22 and the focusing surface 24 is not critical and can be selected to produce a desired length of the solid state laser 10. Regardless of the position of the focusing surface 24, the beamlets 30a-h will always overlap on this surface 24 to provide the required intensity distribution and profile at the focal plane 48 to match the input pump area 44 of the gain medium 14.

Figure 3A:
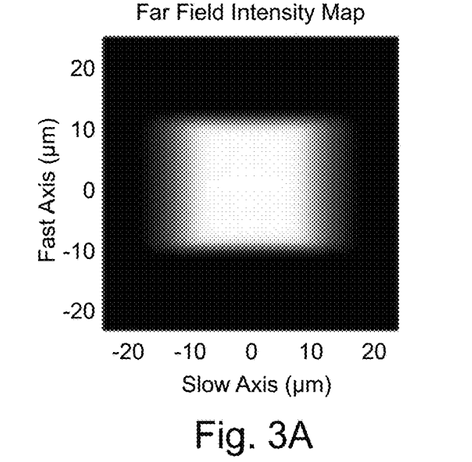
FIGS. 3A, 3B and 3C shows an examples of a simulated intensity profile at the focal plane by (3A) far field intensity map and (3B) and (3C) graphs of beam profile as normalised intensity against the fast axis and slow axis respectively.
Figure 3B:
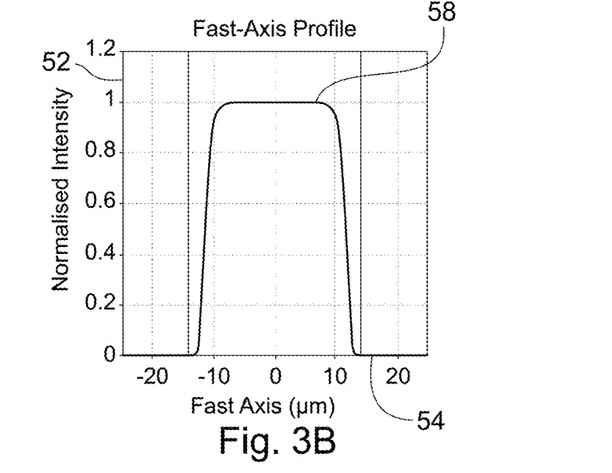
Figure 3C:
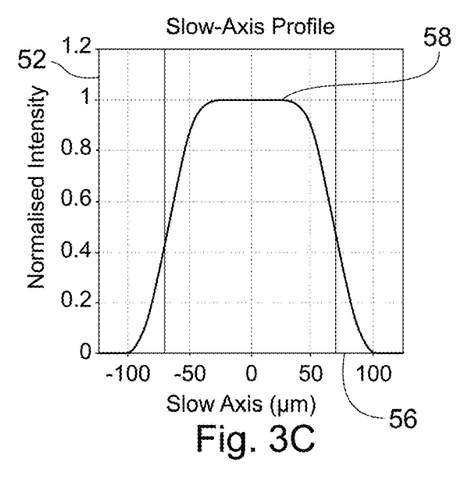

By controlling the maximum and minimum gradient of the continuous twisted surface 22, and the beamlets 30 from the emitters 26 overlap in the far field, an output spot 50 with super-Gaussian intensity profile in both the x and y axes can be produced at the focal plane 48 i.e. the input face 46 of the active medium. For the beamlets 30 to overlap in the far field they will also overlap at the focusing surface 24. Therefore, as compared to the prior art, the beamlets 30 are not kept separate through the optical train 16 but overlap on transmission. Referring to FIGS. 3A, 3B and 3C there is shown an example of a simulated intensity profile at the focal plane 48 of the Fourier lens 36, where the output slow axis divergence of 1.6 deg FWHM is matched in the fast-axis by use the continuous twisted surface 22 to produce a flat top distribution with equivalent width. FIG. 3A shows a far field intensity map illustrating the uniformity, and the square or rectangular profile. FIGS. 3B and 3C are graphs of beam profile 58 as the normalised intensity 52 against the fast axis 54 and slow axis 56, respectively.

The linearly varying gradient in the fast-axis of the continuous twisted surface 22, is such that each diodes slow-axis beamlet 30a-h extent will see the same variation in angle but over a different angle range. All individual beamlets 30a-h from the collimated laser diode array 12 are widened and slightly deflected in the fast axis so that they overlap in the far field distribution to create an intensity distribution with a flat top envelope. The far field pattern is a composition of the multiple beamlets 30a-h overlapping, with slight offset between individual beams in the fast axis. A careful design of the twisted surface allows to produce a flat top fast-axis intensity profile with minimum 'hot spots' (high intensity uniformity), as illustrated in the drawings on the right hand side of FIGS. 1A and 1B.

The continuous twisted surface 22 surface definition (Equation 1) handles the fast-axis divergence via the following relationship:

$$\alpha = \frac{(\theta_{target} - \theta_{residual})}{(n_{SiO_2} - n_{air})}$$

With $\theta_{target}$ being the desired output divergence, and $\theta_{residual}$ being the residual fast-axis divergence at the entrance of the twister surface.

A further scaling factor is required depending on which width metric is being used (FWHM, D4σ), which will modify the gradient 'seen' at this cut-off point to the required fast-axis divergence.

The corresponding functional description is provided by considering the individual beamlets from each diode in an array.

The intended input source is a N-element 1D array of diode sources (along x-axis) separated by a spatial period A, which we will assume individual diode elements have a typical Gaussian intensity profile in the fast-axis, with a super-Gaussian intensity profile in the slow axis (array separation direction).

$$I(x, y) = \exp\left(-\left(\left(\frac{(x-x_0)^2}{2\sigma_x^2}\right)^{P_x} + \left(\frac{(y-y_0)^2}{2\sigma_y^2}\right)^{P_y}\right)\right)$$

For the case of the diode elements we will use $P_x=1$, and $P_x=5$, as representative values, which gives the following description of the diode element intensity distribution:

$$I(x, y) = \exp\left(-\left(\frac{(x-x_0)^2}{2\sigma_x^2} + \frac{(y-y_0)^{10}}{2\sigma_y^{10}}\right)\right)$$

Each diode element N, will effectively interact with a small subset of the total surface dictated by the spatial extent of the diode spot at the optical surface.

$$Z_N = \left[\tan\left(\alpha\left(-1 + \frac{2x}{L_x}\right)y\right) - \tan\left(\alpha\frac{L_y}{2}\right)\right]_{x_0,N-2\sigma_x}^{x_0,N+2\sigma_x}$$

Which by then convolving the subset surfaces with the individual diode input intensity maps we get the individual far field intensity contribution from each element.

$$J_N(x_{0,N-2\sigma_x} \leq x \leq N+2\sigma_x, y) = Z_N(x_{0,N-2\sigma_x} \leq x \leq N+2\sigma_x, y)^* I(x_{0,N-2\sigma_x} \leq x \leq N+2\sigma_x, y)$$

Therefore, the total intensity from the entire diode array is given by:

$$\sum_{n=1}^{N} J_N(x_{0,N-2\sigma_x} \leq x \leq N+2\sigma_x, y)$$

In practical terms, the individual beamlets 30 are offset in the far field by the angle corresponding to the gradient seen by the central slice of each emitter 26 (or, equivalently, to the average gradient across each input beamlet). The gradient extent across the surface 22 (the twist) is set to produce a deflection angle range corresponding to the difference between the input fast axis divergence and a target width of the flat top distribution.

Figure 4A:
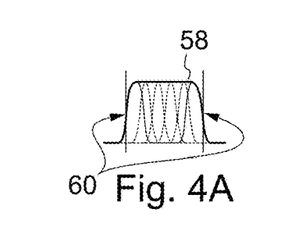
FIGS. 4A, 4B and 4C are beam profiles illustrating far field beamlet overlap in the fast axis.
Figure 4B:
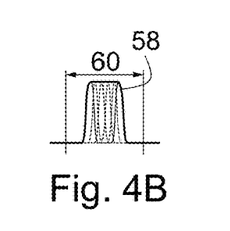

FIG. 4 shows how varying the twist, the extent of gradient change in the slow axis, affects the far field width and overlap, and therefore uniformity across the fast axis. FIG. 4A shows the beamlets 30 overlapping in the far field over a target width 60. This produces the optimum width and uniformity in the beam profile 58 in the fast axis in the far field from the optimum gradient change over the twisted, continuous twisted surface 22. By use of a Fourier lens 36, the beam 50 width and uniformity is reproduced at the focal plane 48 for input to the active medium 14. FIG. 4B illustrates the beam profile 58 when the gradient change across the surface 22 is too slow. There is a greater degree of beamlet overlap and the target width 60 is underfilled.

Figure 4C:
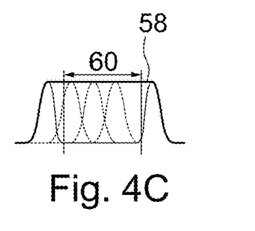

FIG. 4C illustrates the beam profile 58 in the slow axis when the gradient change across the surface 22 is too fast. There is a lack of overlap between neighbouring beamlets, with a width greater than the target width 60 and very poor uniformity caused by the distinctly separate beamlet profiles.

Figure 5:
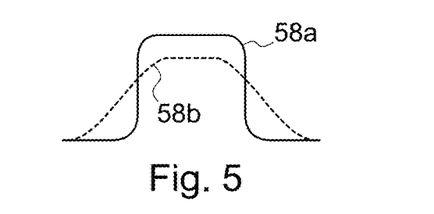
FIG. 5 shows beam profiles in the slow axis far field illustrating the effect of slow axis gradient range on the twisted surface.

The continuous twisted surface 22 also introduces a gradient in the slow-axis. However, the effect this has on the beam profile 58 can be mitigated based on how much of the surface is 'seen' by the individual diode, by where the surface 22 is placed in the optical train (FIGS. 1A and 1B). The surface design and the position of the continuous twisted surface 22 with regards to the laser diode array 12 must be optimised to minimise the impact on slow axis far field distribution while producing the desired intensity uniformity and distribution width 60 in the fast-axis. If the slow-axis gradient on the twisted surface 22 seen by each beamlet 30 is significant in comparison with the intrinsic slow-axis angular spectrum, the edge steepness of the super-Gaussian distribution 58 in slow-axis will be reduced, leading to a "washed down" intensity profile. This is seen in FIG. 5 showing a comparison between an optimum beam profile 58a and the 'washed off' profile 58b with the loss of edge steepness.

In practice, for a fixed bar 15 geometry (number of emitters 26 and pitch 28), the maximum angular output distribution in the fast-axis (the angular width of the fast-axis flat top distribution) will be limited by the fastest gradient change that can be maintained over the slow-axis width of each beamlet before it starts to affect the slow-axis beam properties.

In a method for pumping a solid state laser 10 having an active medium 14 with a pump area 44, the beam profile 58 is sized to match the input pump area 44. To achieve this, the surface definition of the continuous twisted surface 22 and the placement of the surface 22 and focusing surface 24, is selected under the following criteria.

The beamlet 30 overlap in the slow-axis direction at the plane of the continuous twisted surface 22 determines the overlap in the fast axis in the far field. For beams divergent in slow-axis direction, the beamlet overlap will vary with the distance between the continuous twisted surface 22 and the laser array 12 therefore an optimum distance must be selected. The optical clear aperture on the continuous twisted surface 22 is then set based on expected beamlet 30 sizes at intended distance from the laser bar 15.

Figure 6A:
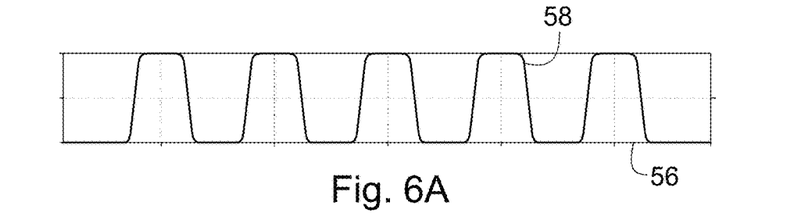
FIGS. 6A, 6B, 6C, 6D, 6E, 6F, 6G, 6H, 6I, 6J, 6K, and 6L are illustrations of the beam profile in the fast axis and slow axis in the far field and the slow axis distribution at the beam transformation optical element for different degrees of overlap of neighbouring beamlets.
Figure 6B:
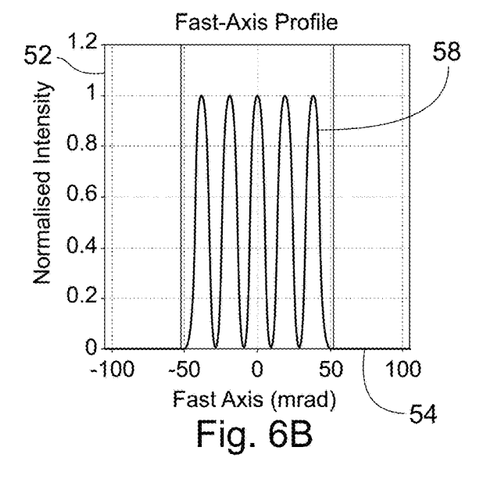
Figure 6C:
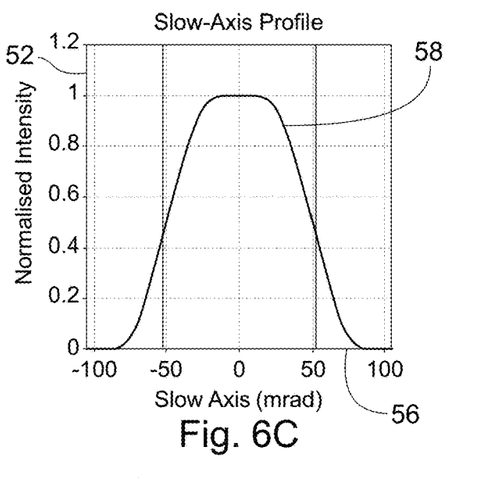
Figure 6D:
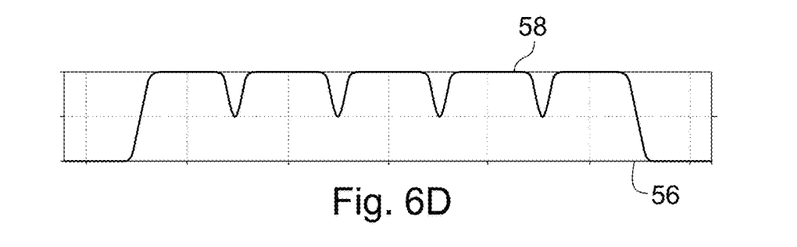
Figure 6E:
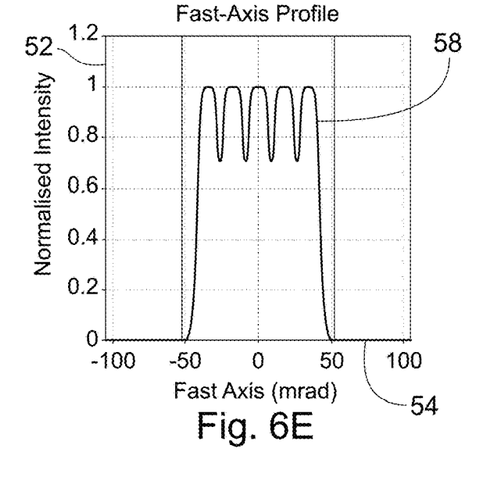
Figure 6F:
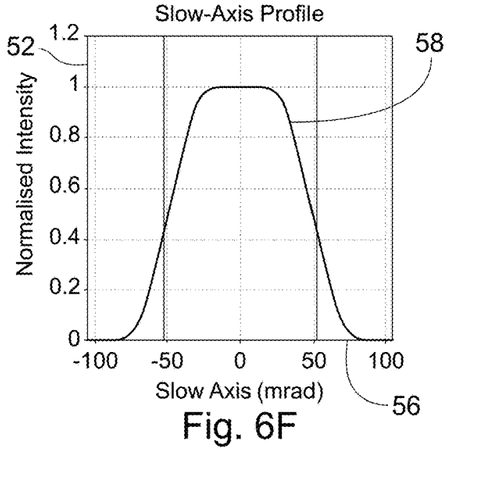
Figure 6G:
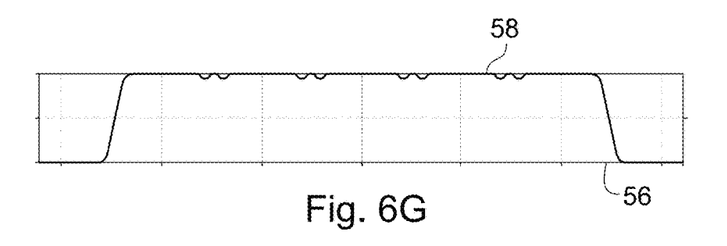
Figure 6H:
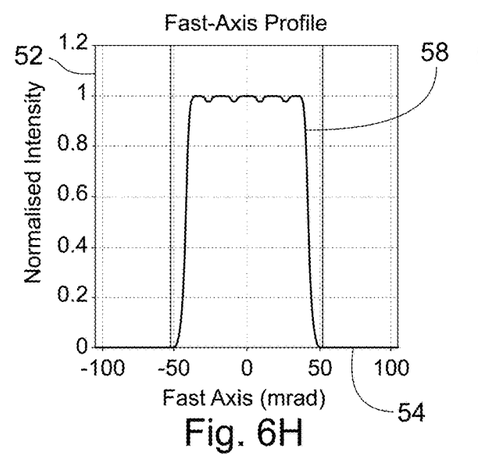
Figure 6I:
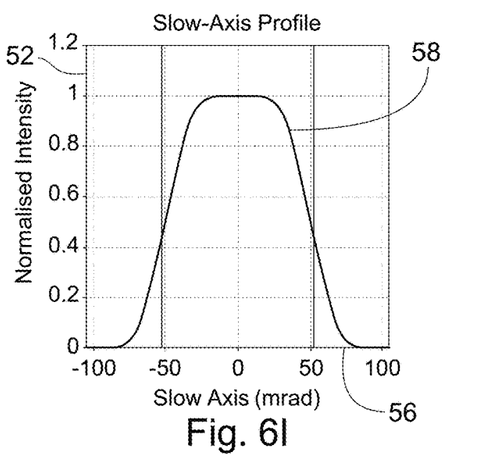
Figure 6J:
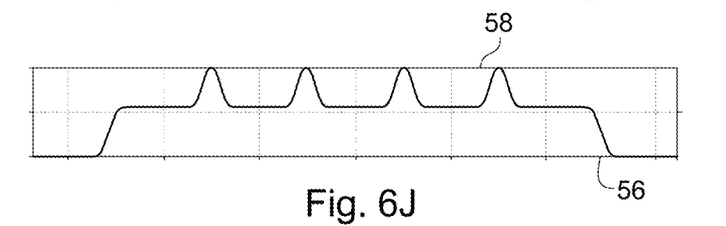
Figure 6K:
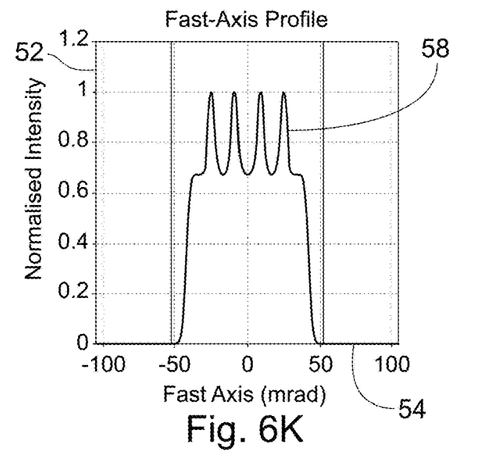
Figure 6L:
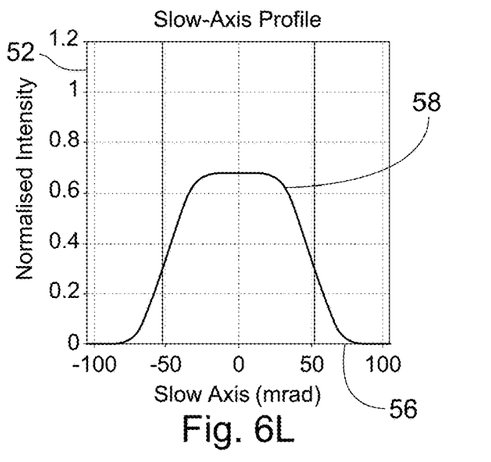

The optimum position is selected to obtain the maximum intensity uniformity achievable within a given geometry. FIGS. 6A, 6B, 6C, 6D, 6E, 6F, 6G, 6H, 6I, 6J and 6L illustrate the impact of the beamlet 30 overlap at the continuous twisted surface 22. FIGS. 6A, 6D, 6G, 6J show the profile 58 of the intensity distribution 52 across the slow axis 56 at the continuous twisted surface 22 and the corresponding output far field profiles 58 in the fast axis 54, FIGS. 6B, 6E, 6H, 6K, and slow axis 56, FIGS. 6C, 6F, 6I, 6L, produced with otherwise identical continuous twisted surface 22 and laser diode array 12. For insufficient overlap, where slow-axis profile cross at half maximum intensity point, FIG. 6D or less, FIG. 6A, the dips in fast-axis far field profile 58, FIGS. 6E and 6B respectively, are pronounced, resulting in 0.6-0.8 uniformity or less. Uniformity is measured as valley intensity/maximum intensity. At the optimum point, FIG. 6G, where the beam profile cross near the maximum energy slow-axis, high uniformity is observed in the far field fast axis profile (>0.9 uniformity), FIG. 6H. Further increase in overlap, FIG. 6G, has detrimental effect on the flat top, with spikes in intensity, FIG. 6K, produced due to accumulation of light at overlap angles.

For best results the rate of gradient change in the slow-axis on the continuous twisted surface 22 must be slow enough to allow placing the beam transformation optic element 38 at an optimum overlap position without detrimental impact on the slow-axis far field profile. This is the "washing down' effect described hereinbefore and illustrated in FIG. 6L at overshot in overlap at the continuous twisted surface 22 as compared to the slow-axis far field profiles FIGS. 6C, 6F, 6G of the other arrangements. The design trade-offs must be considered depending on the desired output shape, properties of the diode array and acceptable uniformity of the intensity distribution.

For a specific target spot size at the focal plane 44 i.e. the focus for input to the gain medium 14, focal power of the Fourier lens 36 determines the required angular width 60 of the transformed beam 50. For a fixed bar 15 geometry, selecting the right focal power of the focussing surface 22 can help to help to ease some of the trade-offs in the design flow. It is commonly desirable to create a square intensity distribution where the fast-axis width is matched with the slow axis width. However, a rectangular flat top distribution may also be desirable and can be achieved using this method by either producing rectangular angular distribution after the continuous twisted surface 22 and/or using cylindrical lenses to focus the beam 50 on the pump area 20 as the focusing surface 24 in place of the Fourier lens 36. An embodiment including such an arrangement is described hereinafter with reference to FIGS. 13A and 13B.

Figure 7A:
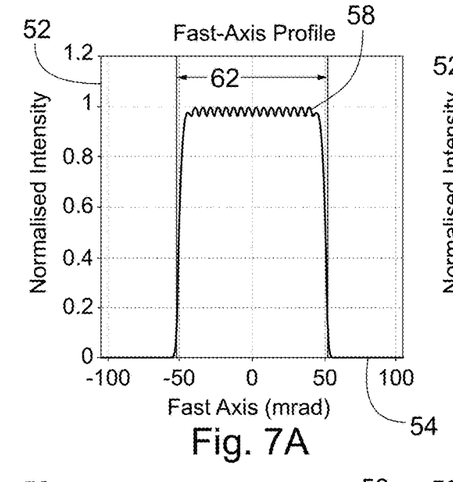
FIGS. 7A and 7B are illustrations of the beam profile in the fast axis and slow axis in the far field respectively with a beam transformation surface optimised for a 19 emitter diode bar.
Figure 7B:
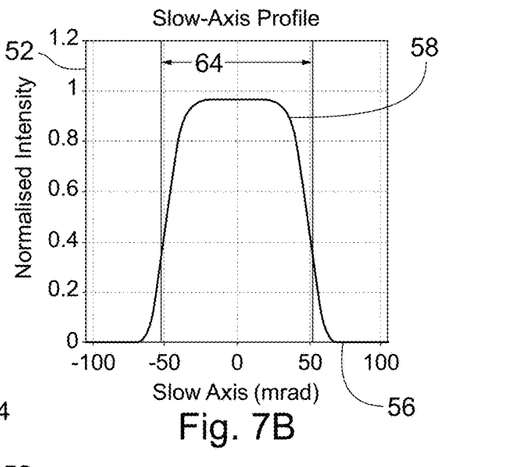

The impact of the laser bar 15 geometry on the beam uniformity can also be considered. FIGS. 7A and 7B show far field intensity profiles in the fast axis (A) and slow axis (B) illustrating the far field intensity distribution produced by a continuous twisted surface 22 for a 19-emitter, 500 um pitch bar with a residual FWHM divergence of approx. 6 deg and 0.1 deg, in the slow- and fast-axis, respectively. After the transformation, the slow-axis far field profile, FIG. 7B, is an unaffected super-Gaussian distribution with 6 deg FWHM divergence. In the fast-axis direction, FIG. 7A, the individual beamlets are widened and offset to create a flat-top intensity distribution.

A square intensity distribution is obtained by matching fast-axis width 62 to the slow-axis width 64 by choosing the angular range on the continuous twisted surface 22 to match the slow axis far field distribution.

Figure 8A:
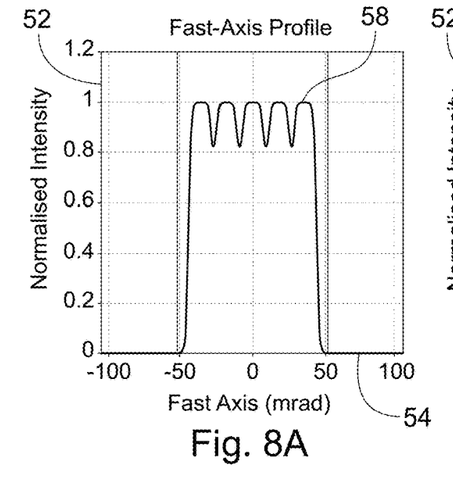
FIGS. 8A and 8B are equivalent illustrations to those of FIGS. 7A and 7B for a 5 emitter diode bar.
Figure 8B:
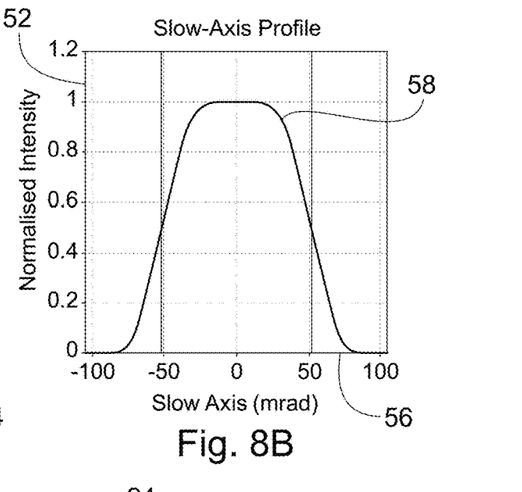

For a bar with only five emitters on the same 500 um pitch 28, the twist of the transformation element 38 needs to be more aggressive to match slow-axis distribution (~6 deg FWHM). This is realised by creating a faster changing gradient across the continuous twisted surface 22. As a consequence, the beamlets see a larger change across the slow-axis with a detrimental impact on far field distribution. This is illustrated in FIGS. 8A and 8B which show far field intensity profile in the fast axis (A) and slow axis (B) illustrating the far field intensity distribution. In the slow-axis profile, FIG. 8B, the edge steepness of the super-Gaussian profile is reduced as compared to that of FIG. 7B. In the fast-axis, FIG. 8A, large gaps between the individual beamlets are seen in far field intensity distribution. In this case, in order to produce a more uniform flat top distribution, a smaller fast-axis angular range would need to be produced.

The two examples of FIGS. 7A,7B and 8A,8B show that for a given target output angular width in the fast axis, high uniformity (>0.9) can only be obtained with the array containing sufficient number of emitters that can be distributed across the angular envelope while maintaining sufficient overlap in angular space.

The preferred configuration is illustrated in FIGS. 1A and 1B, this being to a laser diode array 12 of emitters 26 in a bar 15, a refractive optical element 38 with a continuous twisted surface 22, a Fourier lens 36 providing a focusing surface 22 and a solid state laser having an active gain media 14. The transformation surface 22 is on a beam transformation element 38 being a single continuous refractive surface element fabricated in fused silica. The Fourier lens 36 is then placed after the beam transformation optical element 38 to generate a uniformed and symmetrised beam at its focus being the input pump area 44 at the input face 46 of the active gain medium 14 in the solid state laser 10. In this embodiment the diode bar 15 could include a fast axis collimator 32 and/or a slow axis collimator 34.

Figure 9A:
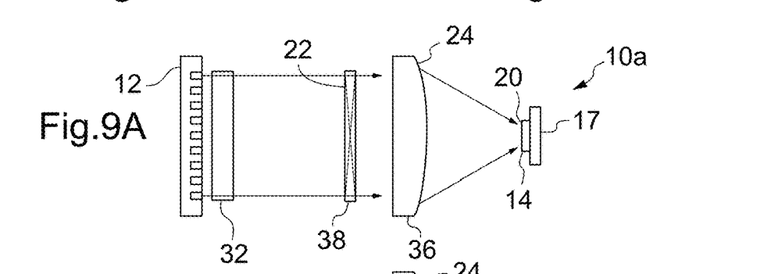
FIGS. 9A and 9B are schematic illustrations of a diode pumped solid state laser in the (9A) x-z plane and (9B) y-z plane according to a further embodiments of the present invention.
Figure 9B:
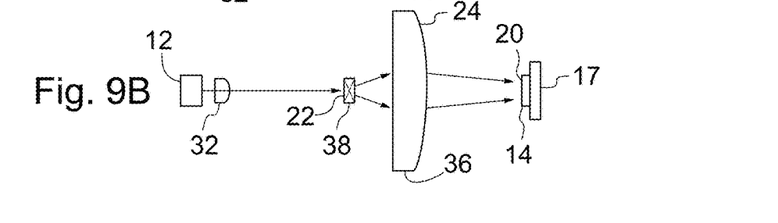
Figure 10A:
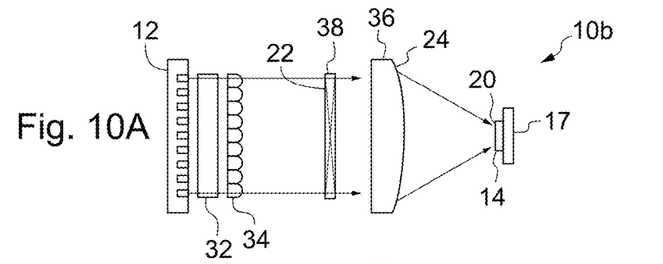
FIGS. 10A and 10B are schematic illustrations of a diode pumped solid state laser in the (10A) x-z plane and (10B) y-z plane according to a further embodiment of the present invention.
Figure 10B:
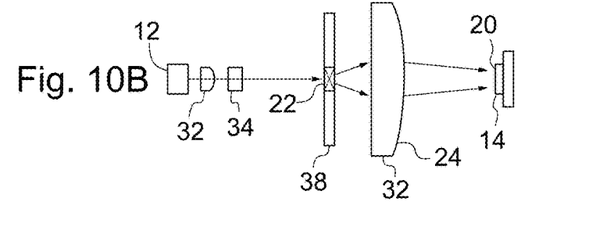

Referring now to FIGS. 9A and 9B of the drawings, there is illustrated a solid state laser, generally indicated by reference numeral 10a, according to a further embodiment of the present invention. Like parts to those of FIGS. 1A and 1B have been given the same reference numeral to aid clarity. Laser 10a now includes a fast axis collimator 32 arranged in front of the laser diode array 12 being separate therefrom. A corresponding arrangement with a fast axis collimator 32 and a slow axis collimator 34 arranged in front of the laser diode array 12, is shown in the embodiment of FIGS. 10A and 10B for solid state laser 10b. The slow-axis intensity distribution at the focal plane 48 of the Fourier lens 36 would be determined by the divergence of the laser diode array 12 after slow-axis collimation. The fast-axis distribution can be matched with regards to the width 60 to form a square pattern. It is also possible, if desirable, to create rectangular flat top intensity distribution if the pump area 20 is oblong.

Figure 11A:
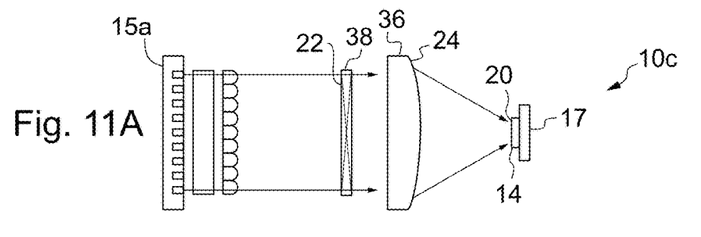
FIGS. 11A and 11B are schematic illustrations of a diode pumped solid state laser in the (11A) x-z plane and (11B) y-z plane according to a further embodiment of the present invention.
Figure 11B:
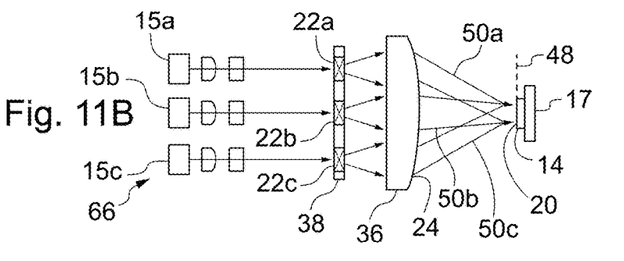
Figure 15:
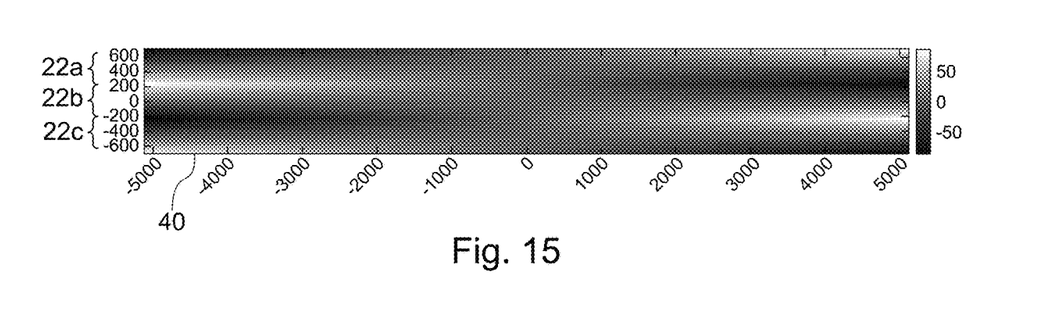
FIG. 15 is an illustration of a beam transformation optical element surface for the three bar stack of FIGS. 11A and 11B.

While a single laser diode bar 15 is shown in FIG. 1, a laser diode bar stack 66 could also be used as shown in the laser 10c of FIGS. 11A and 11B to increase the pump power. The two dimensional bar stack 66 is shown with three diode bars 15a-c, but there could be any number. The beam transformation optical element 38 now has a number of continuous twisted surfaces 22, shown in FIG. 15 is be mirror-tiled along the fast-axis, with respective sections 22a-c, to generate a large surface that transforms beamlets from individual bars 15a-c. The outputs 50a-c from the bars 15 would then be overlaid at the focal plane 48 of the Fourier lens 36 to match the pump area 20 of the active gain medium 14.

Figure 12A:
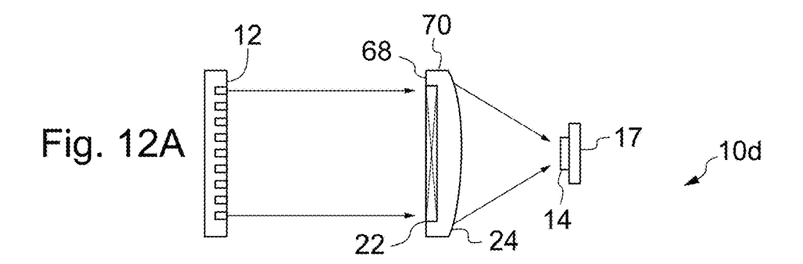
FIGS. 12A and 12B are schematic illustrations of a diode pumped solid state laser in the (12A) x-z plane and (12B) y-z plane according to a further embodiment of the present invention.
Figure 12B:
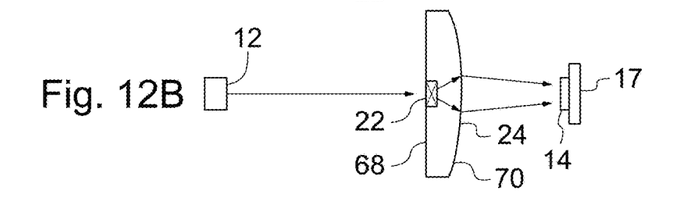

As the distance between the beam transformation optical element 38 continuous twisted surface 22 and the focusing surface 24, typically the Fourier lens 36, is not critical, the continuous twisted surface 22 can be written on the planar side 68 of a plano-convex focusing lens 70. This embodiment of a solid state laser, generally indicated by reference numeral 10d, is illustrated in FIGS. 12A and 12B. The focusing surface 24 is on the opposite side of a single optical element 70. This embodiment reduces the number of optical elements in the optical train 16 and improves compactness.

Figures 13A, 13B:
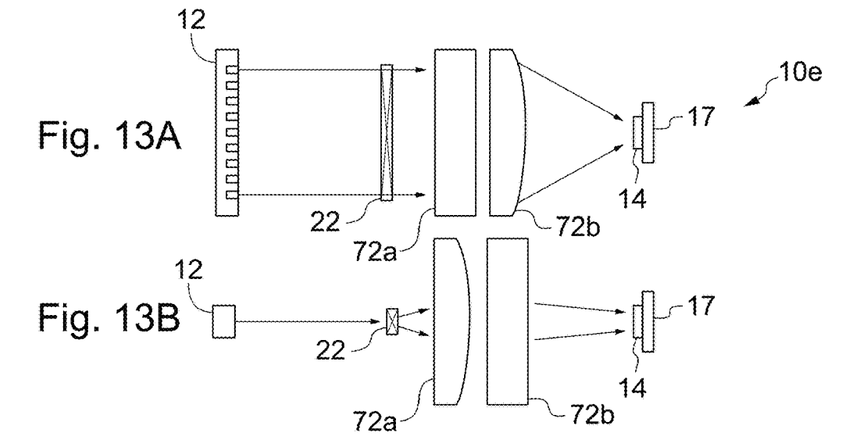
FIGS. 13A and 13B are schematic illustrations of a diode pumped solid state laser in the (13A) x-z plane and (13B) y-z plane according to a further embodiment of the present invention.

A further embodiment of a solid state laser, generally indicated by reference numeral 10e, is shown in FIGS. 13A and 13B. In this arrangement, the single Fourier lens 36 is replaced with a set of two orthogonal cylindrical lenses 72a,b. the lenses combine to provide an apparent focusing surface. Using cylindrical lenses 72a,b to focus the beamlets 30 allows a designer to control the width 60 of the flat top distribution. This can be used when a rectangular flat top is desirable or when the square flat top is required but cannot be produced with a continuous twisted surface 22 with a given bar 15 geometry.

Figure 14A:
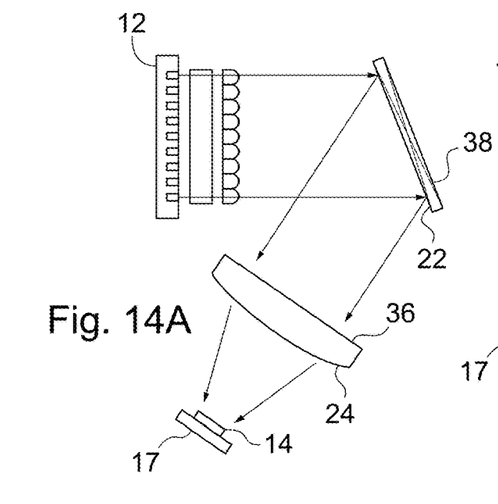
FIGS. 14A and 14B are schematic illustrations of a diode pumped solid state laser in the (14A) x-z plane and (14B) y-z plane according to a further embodiment of the present invention.
Figure 14B:
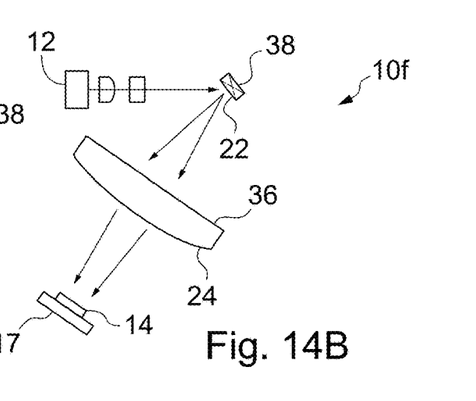

FIGS. 14A and 14B show a further embodiment of a solid state laser, generally indicated by reference numeral 10f, according to the present invention. In this arrangement, the continuous twisted surface 22 is on an optical element 38 with the entry face 40 being mirrored to create a reflective optic. Such a reflective beam transformation optical element 38 can be designed and manufactured and subsequently HR coated, as is known in the art, to perform the equivalent beam transformation to the refractive version described hereinbefore. This arrangement provides a turn in the optical axis through the optical train 16 which may suit applications in which the solid state laser 10f is to be incorporated.

Figure 16:
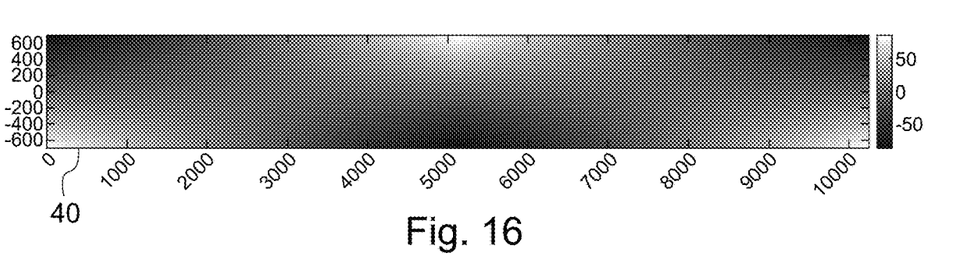
FIG. 16 is an illustration of a beam transformation optical element surface for multiple twists.

In the preferred embodiment, the beam transformation optical element 38 has a continuous twisted surface 22 comprising a single twist, that is a single inversion of the min/max gradient in the fast axis. As the continuous twisted surface will be laser machined into fused silica such a technique can have limitations in the cut depth due to current manufacturing capabilities. A single twist over a very long diode bar length can require a cut depth outside current manufacturing capabilities. An embodiment of a beam transformation optical element 38 providing a surface with a plurality of twists, continuous twisted surfaces 22, can circumvent this. FIG. 16 illustrates a tonal map of the design surface 40 with two twists along the slow axis. Further twists may be added with each being modified to direct the beamlets incident upon them to form a single uniform and symmetrised beam in the far field. However, this could make the system more sensitive to disrupting the flatness of the slow axis due to higher slow-axis gradients for the same output far field angles.

Figure 17A:
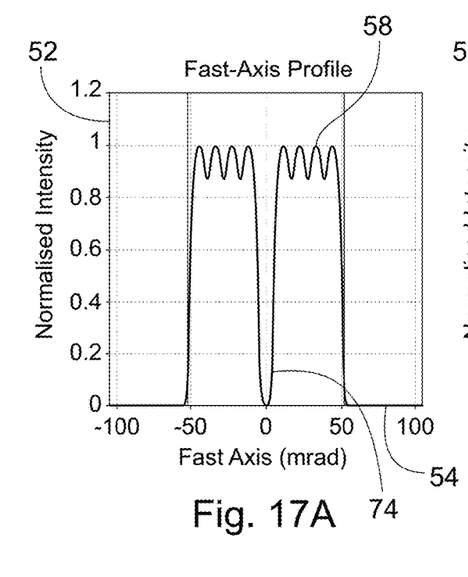
FIGS. 17A and 17B are illustrations of the beam profile in the fast axis and slow axis in the far field respectively with a dead emitter in the diode bar.
Figure 17B:
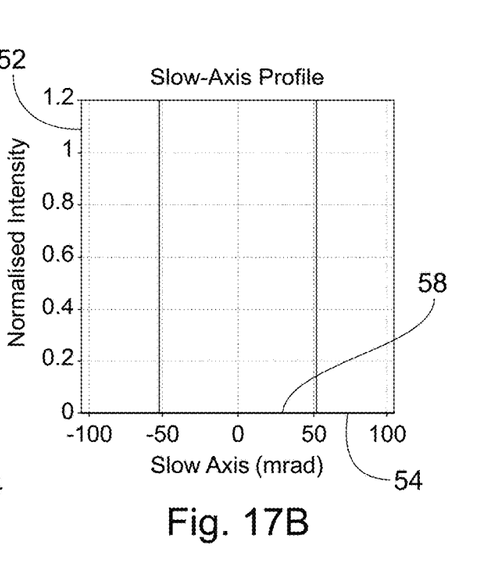
Figure 18A:
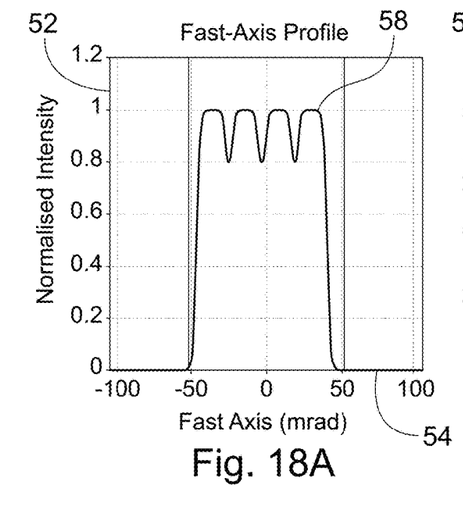
FIGS. 18A and 18B are equivalent illustrations to those of FIGS. 17A and 17B for the same diode bar with a compensating beam transformation optical element.
Figure 18B:
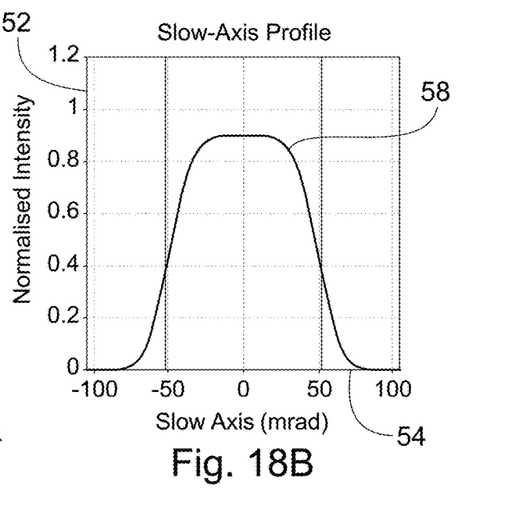

The beam transformation optical element 38 can also be designed to compensate for one or more dead emitters 26 in the diode bar 15. As shown in FIGS. 17A and 17B for a bar 15 with a central dead emitter, the far field distribution in both the (A) fast axis 54 and (B) slow axis 56 will have a dip 74 dropping to zero or near zero in the beam profile 58 of normalised intensity in the area corresponding to the dead emitter. This can be mitigated by distributing some of the power from other emitters into the dip region. The beam transformation optical element 38 has continuous twisted surfaces modified from the linear character of the gradient change by adding the 'missing' slope content in the areas illuminated by other emitters. In an embodiment, the linear gradient is maintained but is now formed as a v-shape in the fast axis, so that the gradient switches direction in the middle of the optical element 38 with a continuous twisted surface 22 of each gradient on either side of the dead emitter position. This means that for a diode bar 15 having a dead central emitter 26, the diode bar is effectively treated as two half bars, with the beamlets in each half being directed over the same angular range, by angular binning. FIGS. 18A and 18B show the compensated normalised intensity profile 58 for such a dead emitter compensation arrangement indicating the apparent disappearance the dip 74. There is some penalty in uniformity due to the smaller number of beamlets available to create annular staggering, but the missing emitter is no longer evident. It will be realised that while a central dead emitter is shown, truncated continuous twisted surfaces can be used on either side of a dead emitter at any location along the diode bar.

The principal advantage of the present invention is that it provides a diode pumped solid state laser in which a pump beam with a uniform and symmetric flat top distribution is produced at a focus plane of entry to the gain medium from a simple optical train which does not require to be matched exactly with the emitter pitch in the diode array.

A further advantage of the present invention is that it provides a diode pumped solid state laser in which a pump beam with a uniform and symmetric flat top distribution is produced at a focus plane of entry to the gain medium from a simple optical train which completely utilizes the aperture due to lack of transition zones.

A still further advantage of the present invention is that it provides a diode pumped solid state laser in which a pump beam with a uniform and symmetric flat top distribution is produced at a focus plane of entry to the gain medium from a simple optical train which is insensitive to the central thickness of the transformation optic in the train as rotation of each emitter is not achieved through the defined centre thickness as the method for transformation relies on refraction (or reflection) on one optical surface only.

It will be appreciated by those skilled in the art that modifications may be made to invention herein described without departing from the scope thereof. For example, the optical elements may be formed from other materials than fused silica.

We claim:

1. A diode-pumped solid state laser comprising:
    a laser diode array formed of a plurality of emitters in a laser diode bar, the emitters arranged along an x-axis, being a slow axis, with a height in a y-axis, being a fast axis, to direct a beamlet from each emitter in a direction parallel to a z-axis, in a x,y,z coordinate system;
    a solid state active medium having an input pump area;
    an optical train, located between the laser diode array and the solid state laser, comprising:
        a beam transformation optical element, positioned to intersect the beamlets, the beam transformation optical element including a first continuous twisted surface in which the fast axis gradient varies along the slow axis, causing beamlet redirection in the fast axis; and
        a focusing surface, positioned to intersect the beamlets from the first continuous twisted surface and focus the beamlets into a uniform and symmetrised beam at a focal plane;
    characterised in that:
    the first continuous twisted surface is between the emitters and the focusing surface;
    the solid state active medium is positioned so that an input face of the input pump area intersects the beamlets from the focusing surface is at the focal plane of the focusing surface; and
    in use, a portion of neighbouring beamlets overlap and commingle in the slow axis at the focusing surface, and also overlap and commingle at the first continuous twisted surface, to result in overlapping in the fast axis at the focal plane giving the uniform and symmetrised beam with a flat-top intensity distribution at the focal plane.

2. A diode-pumped solid state laser according to claim 1 wherein the laser diode array includes a fast axis collimator.

3. A diode-pumped solid state laser according to claim 1 wherein the laser diode array includes a slow axis collimator.

4. A diode-pumped solid state laser according to claim 1 wherein the beam transformation optical element is a refractive optical element.

5. A diode-pumped solid state laser according to claim 1 wherein the beam transformation optical element is a reflective optical element including a reflective coated surface.

6. A diode-pumped solid state laser according to claim 1 wherein the focusing surface is provided on a Fourier lens.

7. A diode-pumped solid state laser according to claim 1 wherein the focusing surface is provided on a set of two orthogonal cylindrical lenses.

8. A diode-pumped solid state laser according to claim 1 wherein the optical train consists of the beam transformation optical element and a Fourier lens.

9. A diode-pumped solid state laser according to claim 1 wherein the optical train consists of a single optical element wherein the beam transformation optical element is a plano-convex focusing lens with at least the first continuous twisted surface written on a planar side.

10. A diode-pumped solid state laser according to claim 1 wherein the beam transformation optical element includes a plurality of continuous twisted surfaces arranged in a two dimensional array.

11. A diode-pumped solid state laser according to claim 10 wherein at least two continuous twisted surfaces are arranged along the slow axis.

12. A diode-pumped solid state laser according to claim 10 wherein at least two continuous twisted surfaces are arranged in parallel along the fast axis.

13. A diode-pumped solid state laser according to claim 1 wherein the fast axis gradient varies linearly.

14. A diode-pumped solid state laser according to claim 1 wherein there are first and second continuous twisted surfaces arranged along the slow axis and configured to provide a v-shaped gradient in the fast axis, to direct beamlets from each side of a dead emitter on the laser diode bar into the same angular range, by angular binning, to compensate for the dead emitter.

15. A diode-pumped solid state laser according to claim 1 wherein there are at least 11 emitters in the diode bar.

16. A diode-pumped solid state laser according to claim 1 wherein there are more than one diode bar, with the diode bars being arranged in a stack.

17. A diode-pumped solid state laser according to claim 1 wherein the uniform and symmetrised beam has a flat-top rectangular intensity distribution.

18. A method of pumping a diode-pumped solid state laser comprising the steps:
    providing at least one diode bar having an array of emitters, each emitter having an output beamlet;
    directing the output beamlets to be incident upon a beam transformation optical element, the beam transformation optical element including at least a first continuous twisted surface in which the fast axis gradient varies along the slow axis, causing beamlet redirection in the fast axis;
    directly focusing the beamlets from the at least a first continuous twisted surface to form a uniform and symmetrised beam at a focal plane via a focusing surface;
    characterised in that:
    at least a portion of neighbouring beamlets overlap and commingle at the focusing surface and also overlap and commingle at the at least a first continuous twisted surface; and
    the beam is incident on an input face of an input pump area of the solid state laser at the focal plane.

19. A method of pumping a solid state laser according to claim 18 wherein the focusing surface is provided on a Fourier lens.

* * * * *